United States Patent
Wakabayashi et al.

(10) Patent No.: US 10,088,365 B2
(45) Date of Patent: Oct. 2, 2018

(54) LASER ANNEALING APPARATUS

(71) Applicant: Sumitomo Heavy Industries, Ltd., Tokyo (JP)

(72) Inventors: Naoki Wakabayashi, Kanagawa (JP); Masafumi Yorozu, Kanagawa (JP); Yasuhiro Okada, Kanagawa (JP); Takaomi Suzuki, Kanagawa (JP); Sadahiko Kimura, Kanagawa (JP); Masaki Sakamoto, Kanagawa (JP)

(73) Assignee: SUMITOMO HEAVY INDUSTRIES, LTD., Tokyo (JP)

(*) Notice: Subject to any disclaimer, the term of this patent is extended or adjusted under 35 U.S.C. 154(b) by 17 days.

(21) Appl. No.: 15/346,461

(22) Filed: Nov. 8, 2016

(65) Prior Publication Data

US 2018/0128686 A1   May 10, 2018

(51) Int. Cl.
  *G01J 5/00* (2006.01)
  *G01J 5/08* (2006.01)
  *B23K 26/03* (2006.01)

(52) U.S. Cl.
  CPC .......... *G01J 5/0003* (2013.01); *B23K 26/034* (2013.01); *G01J 5/0853* (2013.01)

(58) Field of Classification Search
  CPC ...... G01J 5/0003; G01J 5/0853; B23K 26/034
  USPC .................................................... 250/338.3
  See application file for complete search history.

(56) References Cited

U.S. PATENT DOCUMENTS

2009/0200279 A1* 8/2009 Li ............... B23K 26/0648
219/121.66

FOREIGN PATENT DOCUMENTS

| EP | 2 574 418 B1 | 3/2015 |
| JP | 2012-011402 A | 1/2012 |
| JP | 2013-058610 A | 3/2013 |
| JP | 2013-074019 A | 4/2013 |
| JP | 2014-192277 A | 10/2014 |

OTHER PUBLICATIONS

Translation of JP2014192277 (A), Hideshi, Oct. 6, 2014.*
Translation of JP2013058610 (A), Hideshi, Mar. 28, 2013.*
Supplementary European Search Report in European Application No. 16196511.6, dated Mar. 2, 2017.

* cited by examiner

*Primary Examiner* — Marcus Taningco
*Assistant Examiner* — Gisselle Gutierrez
(74) *Attorney, Agent, or Firm* — Michael Best & Friedrich LLP (57) ABSTRACT

An annealing object is held at a position on which a laser beam output from a laser light source is incident. An infrared detector detects heat radiation light from the annealing object. An optical element which does not allow light having a wavelength shorter than 1 μm to be incident on the infrared detector is disposed in a pathway of the heat radiation light from the annealing object to the infrared detector.

8 Claims, 12 Drawing Sheets

LASER ANNEALING APPARATUS

BACKGROUND

Technical Field

Certain embodiments of the present invention relate to a laser annealing apparatus.

Description of Related Art

In a manufacturing process for an insulated gate bipolar transistor (IGBT), a buffer layer is formed in a deep region in a range of about 1 to 3 μm from the back surface of a substrate. For this reason, it is necessary to activate a dopant ion-implanted into the deep region. In the related art, there is disclosed a laser annealing apparatus suitable for activation annealing of a dopant implanted into a deep region. In this laser annealing apparatus, a pulsed current having a top-flat time waveform is supplied to a laser diode. In this way, even at low peak power density, it is possible to perform sufficient annealing.

SUMMARY

According to an embodiment of the present invention, there is provided a laser annealing apparatus including: a laser light source which outputs a laser beam; a stage which holds an annealing object at a position on which the laser beam output from the laser light source is incident; an infrared detector which detects heat radiation light from the annealing object held on the stage; and an optical element which is disposed in a pathway of the heat radiation light from the annealing object to the infrared detector and does not allow light having a wavelength shorter than 1 μm to be incident on the infrared detector.

DETAILED DESCRIPTION

The activation rate of a dopant can be presumed by measuring the sheet resistance of a semiconductor substrate. For the measurement of the sheet resistance, usually, a four-probe method is used. However, it is difficult to measure sheet resistance due to a dopant implanted into a deep region in a range of about 1 μm to 3 μm, by the four-probe method. For the measurement of the activation rate, a spreading resistance measurement method is adopted. In order to perform spreading resistance measurement, pre-treatment such as cutting and grinding has to be performed on an annealing object.

It is desirable to provide a laser annealing apparatus in which it is possible to presume the activation rate of a dopant implanted into a deep region.

Light having a wavelength shorter than 1 μm is absorbed by an annealing object made of silicon, and therefore, it is difficult for heat radiation light having a wavelength shorter than 1 μm for being radiated from a deep region to the outside. For this reason, information about the temperature of a relatively shallow region is reflected in the intensity of the heat radiation light having a wavelength shorter than 1 μm, and information about the temperature of a deep region is not reflected in the intensity of the heat radiation light having a wavelength shorter than 1 μm. In contrast, information about the temperatures of both the shallow region and the deep region is reflected in the intensity of heat radiation light having a wavelength longer than 1 μm.

The optical element does not allow heat radiation light having a wavelength shorter than 1 μm to be incident on the infrared detector. For this reason, the degree of contribution of information about the temperature of the shallow region to the detection result of the infrared detector is reduced. As a result, it becomes possible to estimate the activation rate of a dopant in the deep region by using the detection results of the infrared detector and the activation rate conversion data.

Figure 1:
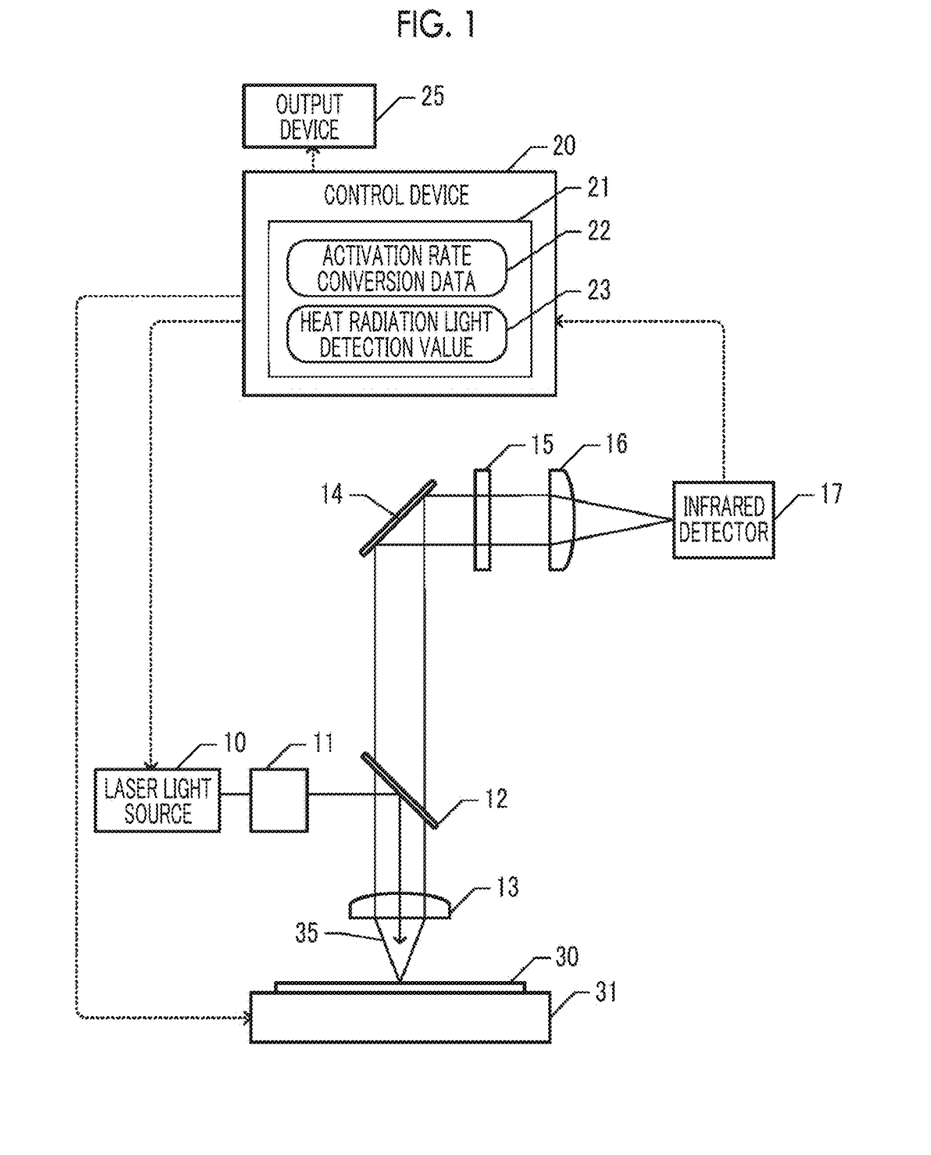
FIG. 1 is a schematic diagram of a laser annealing apparatus according to an embodiment.

FIG. 1 shows a schematic diagram of a laser annealing apparatus according to an embodiment. A laser light source 10 outputs a pulsed laser beam. A beam profile of the pulsed laser beam output from the laser light source 10 is homogenized by a homogenization optical system 11. The pulsed laser beam which has passed through the homogenization optical system 11 is incident on a dichroic mirror 12. The dichroic mirror 12 reflects light in a wavelength range of the pulsed laser beam which is output from the laser light source 10. The pulsed laser beam reflected by the dichroic mirror 12 is converged by a lens 13 and is incident on an annealing object 30. The annealing object 30 is held on a stage 31. The annealing object 30 is, for example, a silicon wafer in which dopant ions are implanted.

The stage 31 is controlled by a control device 20 so as to move the annealing object 30 in an in-plane direction. The entire area of the surface of the annealing object 30 can be annealed by making the pulsed laser beam incident on the annealing object 30 while moving the annealing object 30.

If the pulsed laser beam is incident on the annealing object 30, a surface layer portion of an incident position is heated, whereby a dopant is activated. Heat radiation light 35 is radiated from the heated portion. Some of the heat radiation light 35 is converged by the lens 13. The dichroic mirror 12 transmits light in a wavelength range having a wavelength of 1 μm or more. The heat radiation light 35 which has been transmitted through the dichroic mirror 12 is reflected by a total reflection mirror 14, is transmitted through an optical filter 15 and a lens 16, and is incident on an infrared detector 17.

As the optical filter 15, a long-pass filter or a bandpass filter which does not transmit light in a wavelength range having a wavelength shorter than 1 μm is used. Optical glass configuring optical elements such as the lenses 13 and 16 disposed in the pathway from the annealing object 30 to the infrared detector 17 has a property of absorbing light having a wavelength of about 3 μm or more, and therefore, the upper limit of the wavelength of the heat radiation light which can be detected in the infrared detector 17 is about 3 μm. Therefore, in a case of using the bandpass filter as the optical filter 15, it is preferable that a cut-off wavelength on the long wavelength side is set to be 3 μm or more. The optical filter 15 is disposed in front of the infrared detector 17, whereby a component having a wavelength shorter than 1 μm, of the heat radiation light, is not detected in the infrared detector 17 and only the intensity of a component having a wavelength longer than 1 μm is detected by the infrared detector 17.

Instead of the optical filter 15, another optical element which does not allow heat radiation light having a wavelength shorter than 1 μm to reach the infrared detector 17 may be disposed. As an example, in a case where the dichroic mirror 12 reflects light having a wavelength shorter than 1 μm, the dichroic mirror 12 also functions as the optical element which does not allow heat radiation light having a wavelength shorter than 1 μm to reach the infrared detector 17.

The detection result of the heat radiation light by the infrared detector 17 is input to the control device 20. The control device 20 stores the detection result from the infrared detector 17 in a storage device 21 as a heat radiation light detection value 23 in association with a position in the plane of the annealing object 30. As an example, a temporal change in the intensity of the heat radiation light is obtained for each shot of the pulsed laser beam. The detection result which is stored in the storage device 21 is, for example, a peak value or an integral value of the intensity of the heat radiation light for each shot of the pulsed laser beam.

The lens 13 and the lens 16 form an image of the surface of the annealing object 30 on a light receiving surface of the infrared detector 17. An imaging magnification is, for example, double. The light receiving surface of the infrared detector 17 has a circular shape having a diameter of about 1 mm. A beam spot of the pulsed laser beam on the surface of the annealing object 30 has an elongated shape having a length of about 2.5 mm and a width of about 0.25 mm, for example. In this case, the entire area in a width direction of the beam spot falls within the light receiving surface of the infrared detector 17. With regard to a length direction, only a portion of the beam spot falls within the light receiving surface. By adjusting the position of the light receiving surface of the infrared detector 17, it is possible to receive the heat radiation light from a desired position of the beam spot with regard to the length direction. For example, the heat radiation light from the center of the beam spot with regard to the length direction is incident on the light receiving surface.

By changing the size of the light receiving surface of the infrared detector 17 or the imaging magnification, it is also possible to detect only a portion without detecting the entire area with regard to the width direction of the beam spot. Reducing the area ratio of the area which is detected by the light receiving surface, to the entire area of the beam spot, leads to a decrease in signal intensity which is output from the infrared detector 17. It is preferable to determine the imaging magnification or the size of the light receiving surface of the infrared detector 17 according to a required signal intensity.

The detection result of the infrared detector 17 is input to the control device 20. Activation rate conversion data 22 is stored in the storage device 21 of the control device 20. The activation rate conversion data 22 defines a correspondence relationship between the intensity of the heat radiation light which is detected by the infrared detector 17 and the activation rate of the dopant implanted into the annealing object 30.

The control device 20 determines an estimated value of the activation rate, based on the heat radiation light detection value 23 and the activation rate conversion data 22 stored in the storage device 21. The estimated value is output to an output device 25. As an example, the output device 25 is an image display device, and the distribution of an activation rate in the plane of the annealing object 30 is displayed as an image, a graph, or a numerical value.

The activation rate conversion data 22 is prepared in advance for each type of the dopant and for each ion implantation condition of the dopant. The control device 20 determines an estimated value of the activation rate with reference to the activation rate conversion data 22 corresponding to the type of the dopant implanted into the annealing object 30 and the ion implantation condition.

As the detection result of the infrared detector 17 for obtaining the estimated value of the activation rate, the peak value of the intensity of the heat radiation light which is detected for each shot of the pulsed laser beam can be adopted. In addition, the integral value of the intensity of the heat radiation light which is detected for each shot can also be adopted.

Light in a wavelength range longer than 1 μm is transmitted through a silicon wafer. For this reason, heat radiation light having a wavelength longer than 1 μm is radiated even from a deep region of the annealing object 30 to the outside. In contrast, heat radiation light having a wavelength shorter than 1 μm is easily absorbed by the annealing object 30, and therefore, it is difficult for heat radiation light having a wavelength shorter than 1 μm, which is generated at a deep region, to reach the outside of the annealing object 30. For this reason, information about the temperature of mainly a shallow region is reflected in the intensity of the heat radiation light having a wavelength shorter than 1 μm. In contrast, information about the temperatures of both the shallow region and the deep region is reflected in the intensity of the heat radiation light having a wavelength longer than 1 μm. In the embodiment, heat radiation light in a wavelength range shorter than 1 μm is blocked and heat radiation light in a wavelength range longer than 1 μm is detected in the infrared detector 17. For this reason, it is possible to obtain information about the temperature of not only the shallow region, but also the deep region of the annealing object 30.

The information about the temperature of the deep region of the annealing object 30 is reflected in the detection result of the infrared detector 17, and therefore, it is possible to presume the activation rate of the dopant implanted into the deep region.

If the temperature of the annealing object 30 rises, an energy bandgap is narrowed, and therefore, it also becomes difficult for heat radiation light in a wavelength range slightly longer than 1 μm to be transmitted through the annealing object 30. For this reason, in heat radiation light in a wavelength range near 1 μm, the temperature of the shallow region of the annealing object 30 is greatly reflected and the temperature of the deep region is not easily reflected. As a whole, the temperature of the shallow region is relatively greatly reflected in the heat radiation light in a wavelength range longer than 1 μm.

In order to fully reflect the temperature of the deep region in the intensity of the heat radiation light even if the temperature of the annealing object 30 rises, it is preferable to cut off heat radiation light having a wavelength shorter than 1.5 μm by the optical filter 15, and it is more preferable to cut off heat radiation light having a wavelength shorter than 2 μm.

In a case of using the long-pass filter as the optical filter 15, in order to cut off the heat radiation light having a wavelength shorter than 1.5 μm, it is favorable if a cut-off wavelength is set to be 1.5 μm or be longer than it. In a case of using the bandpass filter as the optical filter 15, it is favorable if a cut-off wavelength on the short wavelength side is set to be 1.5 μm or be longer than it. In order to cut off the heat radiation light having a wavelength shorter than 2 μm, it is favorable if a cut-off wavelength is set to be 2 μm or be longer than it.

If the cut-off wavelength of the long-pass filter or the cut-off wavelength on the short wavelength side of the bandpass filter is set to be too long, most of components of the heat radiation light is cut off by the optical filter 15. In order to maintain the intensity of the heat radiation light which is incident on the infrared detector 17, it is preferable that the cut-off wavelength is set to be 2.5 μm or be shorter than it.

It is preferable that the cut-off wavelength on the long wavelength side of the bandpass filter is set to be 3 μm or more. Heat radiation light having a wavelength of about 3 μm or more is absorbed by the optical element such as the lenses 13 and 16 disposed in the pathway from the annealing object 30 to the infrared detector 17. Therefore, if the cut-off wavelength on the long wavelength side of the bandpass filter is set to be longer than 3 μm, it is possible to maintain high transmittance of heat radiation light in a wavelength range to be detected. In other words, it is possible to suppress a decrease in signal intensity.

Figure 2:
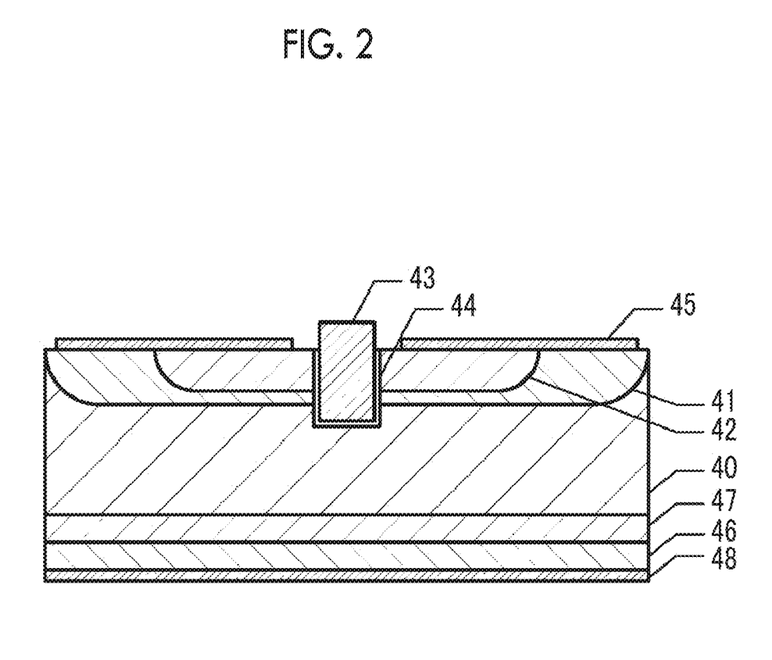
FIG. 2 is a cross-sectional view of an IGBT which is manufactured by using the laser annealing apparatus according to the embodiment.

FIG. 2 shows a cross-sectional view of an IGBT (Insulated Gate Bipolar Transistor) which is manufactured by using the laser annealing apparatus according to the embodiment. In the IGBT, a p-type base region 41, an n-type emitter region 42, a gate electrode 43, a gate insulating film 44, and an emitter electrode 45 are disposed on the surface of an n-type silicon substrate 40. The on-off control of an electric current can be performed by the voltage between a gate and an emitter.

A p-type collector layer 46 is formed on the surface on the opposite side of the silicon substrate 40. An n-type buffer layer 47 is formed at a region deeper than the collector layer 46. The collector layer 46 and the buffer layer 47 are respectively formed by implanting, for example, boron and phosphorus as impurities by ion implantation and performing activation annealing. The laser annealing apparatus shown in FIG. 1 is used in the activation annealing. After the activation annealing, a collector electrode 48 is formed on the surface of the collector layer 46.

Figure 3:
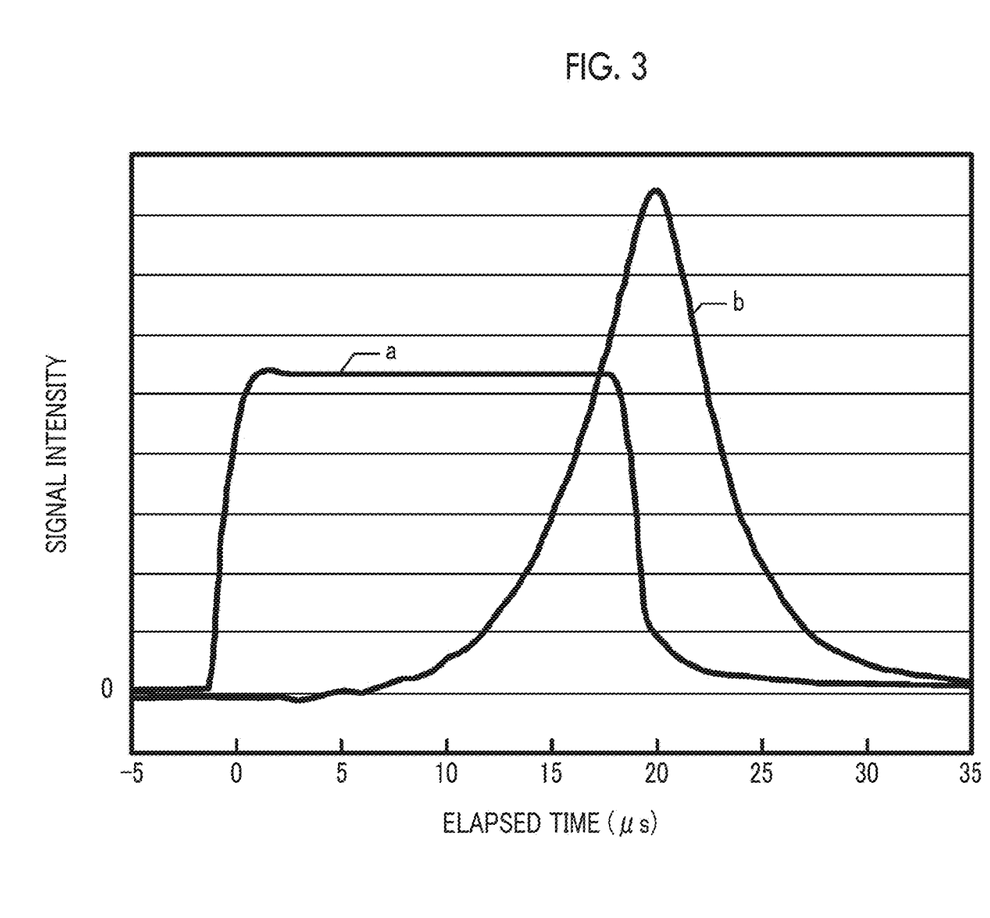
FIG. 3 is a graph showing the measurement results of the waveform of a pulsed laser beam when the pulsed laser beam has been incident on an annealing object by one shot, and an output signal waveform from an infrared detector.

FIG. 3 shows the measurement results of the waveform of the pulsed laser beam when the pulsed laser beam has been incident on the annealing object 30 by one shot, and an output signal waveform from the infrared detector 17. The horizontal axis represents an elapsed time in a unit of "μs", and the vertical axis represents signal intensity. A solid line a shows the waveform of the pulsed laser beam, and a solid line b shows the output signal waveform from the infrared detector 17. The intensity of the output signal of the infrared detector 17 corresponds to the intensity of the heat radiation light from the annealing object 30.

Immediately after the pulsed laser beam has risen, a rise in the temperature of the annealing object 30 is not sufficient, and therefore, the intensity of the heat radiation light is lower than or equal to the detection limit of the infrared detector 17. The intensity of the output signal of the infrared detector 17 begins to increase from the point in time when about 10 μs has elapsed after the pulsed laser beam has risen. From the result of temperature simulation, the surface temperature of the annealing object 30 at this time was about 800° C. If the surface temperature of the annealing object 30 becomes greater than or equal to 800° C., it becomes possible to measure the intensity of the heat radiation light. Further, the surface temperature at which the intensity of the heat radiation light can be measured depends on the sensitivity of the infrared detector 17 or the attenuation amount of the heat radiation light in the pathway from the annealing object 30 to the infrared detector 17.

From the point in time when the pulsed laser beam has fallen, the intensity of the output signal of the infrared detector 17 begins to decrease. This means that the temperature of the annealing object 30 begins to be lowered.

When annealing is performed under the condition that the pulse energy density of the pulsed laser beam which is output from the laser light source 10 is set to be the maximum rated value, it is preferable to adjust the intensity of the heat radiation light on the light receiving surface of the infrared detector 17 such that the signal intensity of the infrared detector 17 is not saturated. For this adjustment, for example, a reflection-type neutral density filter can be used.

Next, the results of an evaluation experiment in which the activation annealing is performed and the intensity of the heat radiation light and the activation rate are measured will be described. As the annealing object 30 (FIG. 1), a silicon wafer in which phosphorus is ion-implanted was used. As the laser light source 10, a laser diode having an oscillation wavelength of 808 nm was used. A beam spot on the surface of the annealing object 30 has an elongated shape having a length of 2.5 mm and a width of 0.25 mm. Main scanning is performed by moving the beam spot at an overlap rate of 67% in a width direction, and thereafter, sub-scanning is performed by moving the beam spot at an overlap rate of 50% in a longitudinal direction. The annealing of almost the entire area of the surface of the annealing object 30 was performed by repeating the main scanning and the sub-scanning.

Figure 4:
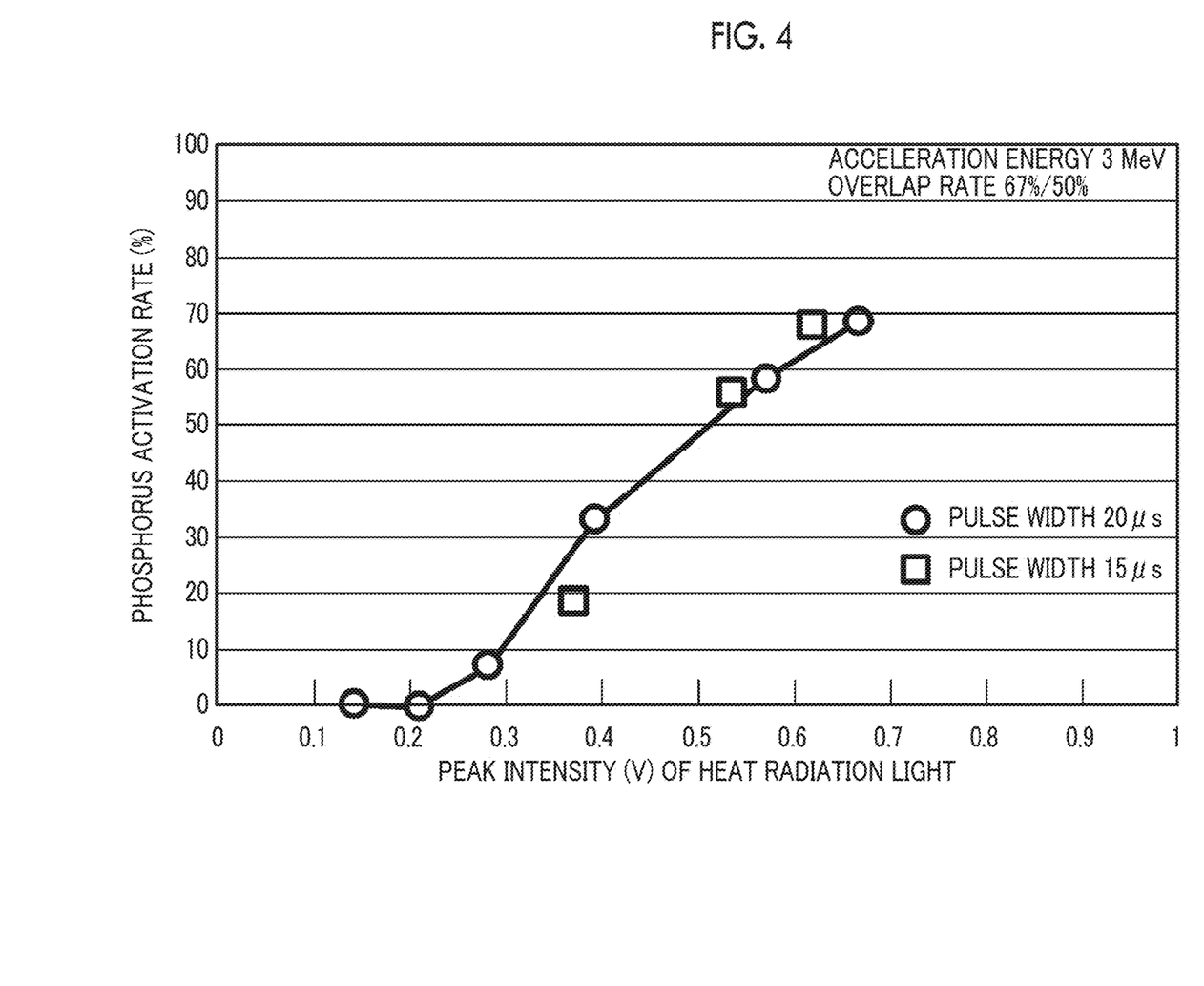
FIG. 4 is a graph showing the relationship between peak intensity of heat radiation light and an activation rate of phosphorus.
Figure 5:
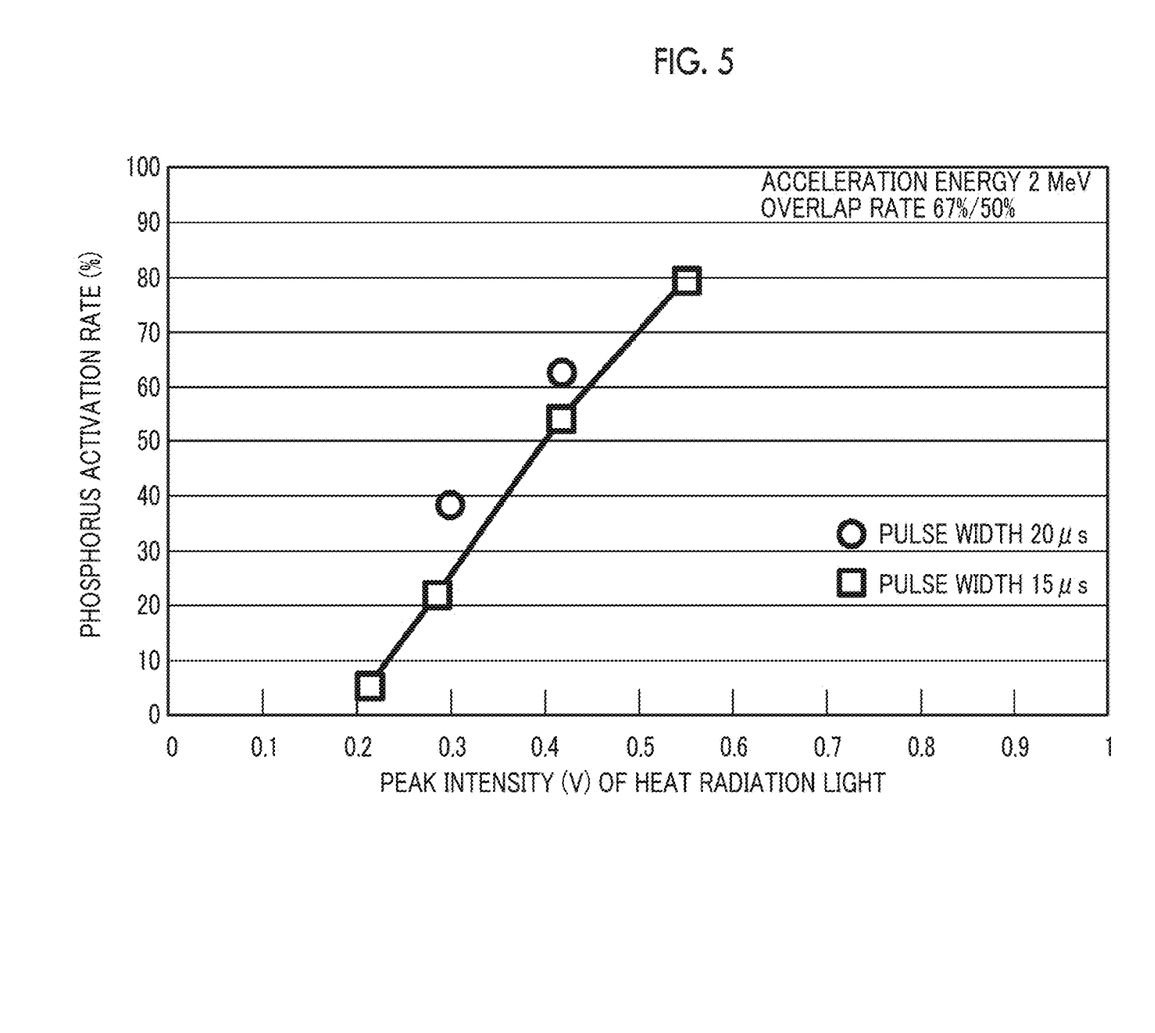
FIG. 5 is a graph showing the relationship between peak intensity of heat radiation light and an activation rate of phosphorus.
Figure 6:
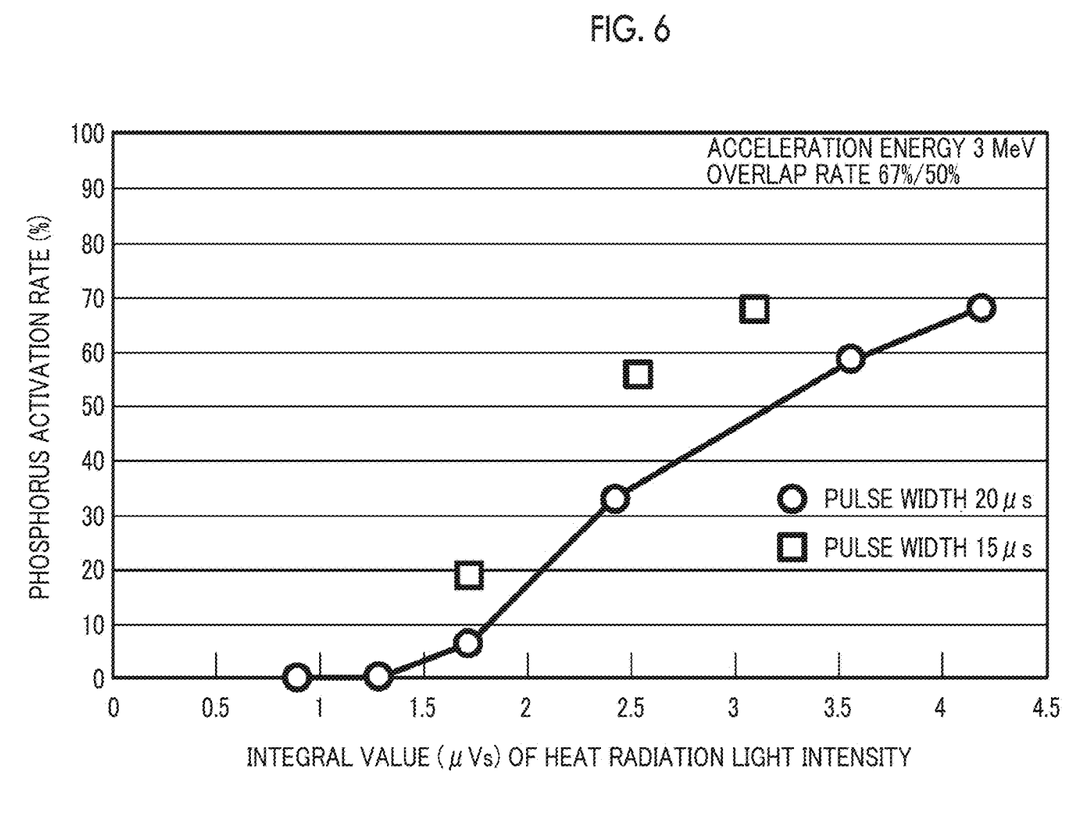
FIG. 6 is a graph showing the relationship between an integral value of intensity of heat radiation light and an activation rate of phosphorus.
Figure 7:
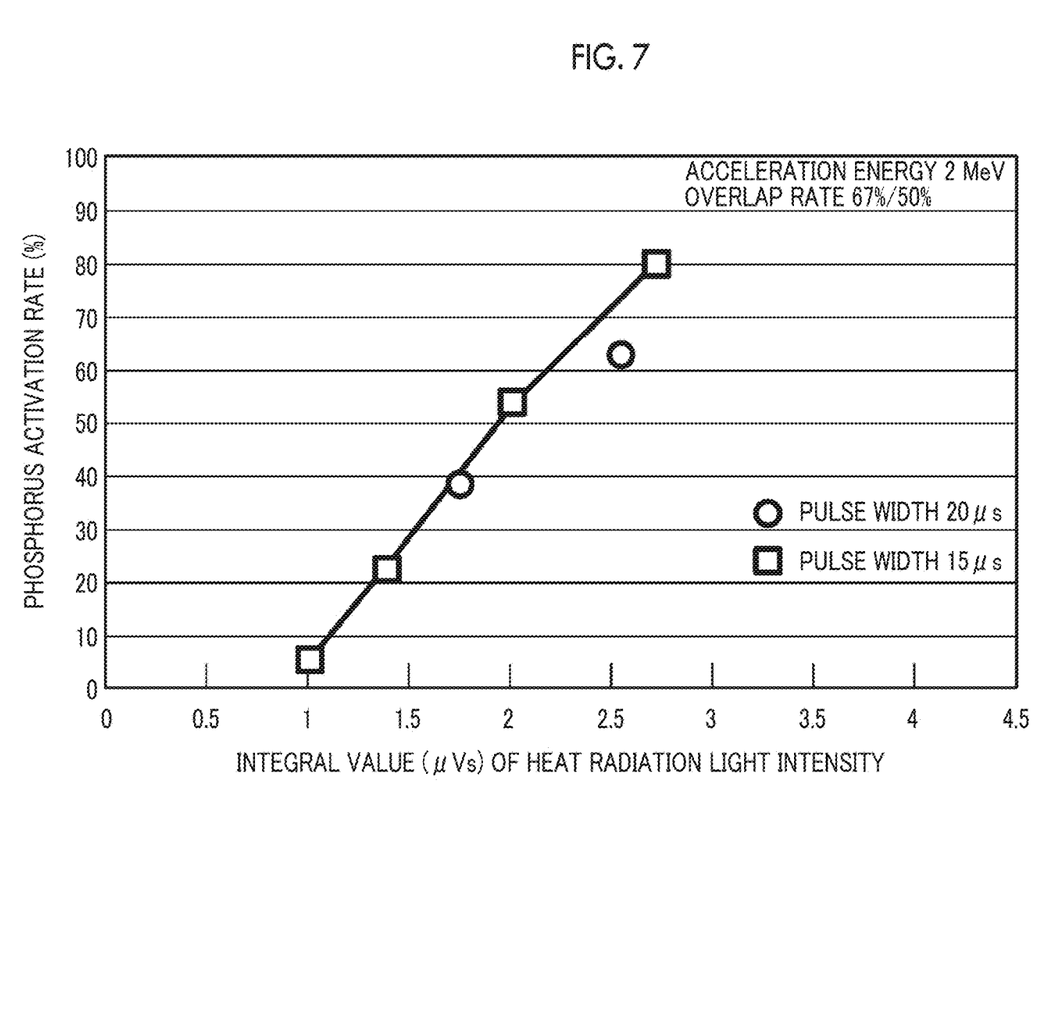
FIG. 7 is a graph showing the relationship between an integral value of intensity of heat radiation light and an activation rate of phosphorus.

The results of the evaluation experiment are shown in FIGS. 4 to 7. FIGS. 4 and 5 show the relationship between the peak intensity of the heat radiation light and the activation rate of phosphorus. FIGS. 6 and 7 show the relationship between the integral value of the intensity of the heat radiation light and the activation rate of phosphorus.

The horizontal axes of FIGS. 4 and 5 represent the peak intensity of the heat radiation light in a unit of "V" of the output signal from the infrared detector 17, and the vertical axes represent the activation rate of phosphorus in a unit of "%". The circle symbol and the square symbol of FIGS. 4 and 5 respectively show the activation rates when annealing was performed under conditions of the pulse widths of 20 μs and 15 μs. The annealing objects 30 used in the evaluation experiments of FIGS. 4 and 5 are silicon wafers in which phosphorus was ion-implanted at the respective acceleration energies of 3 MeV and 2 MeV. The dose amount of phosphorus is $5 \times 10^{12}$ cm$^{-2}$ in any evaluation experiment of FIGS. 4 and 5.

In a case where phosphorus was ion-implanted under the condition that the acceleration energy is 3 MeV, impurity concentration shows a peak at a depth of about 2 μm and a base of an impurity concentration distribution extends to a depth of about 4 μm. In a case where phosphorus was ion-implanted under the condition that the acceleration energy is 2 MeV, impurity concentration shows a peak at a depth in a range of 1.6 μm to 1.8 μm and a base of an impurity concentration distribution extends to a depth of about 3 μm.

From FIGS. 4 and 5, it can be seen that the activation rate becomes higher as the peak intensity of the heat radiation light increases. For this reason, by referring to the correspondence relationship between the peak intensity of the heat radiation light and the activation rate, it is possible to obtain the estimated value of the activation rate from the peak intensity of the heat radiation light. In this embodiment, the activation rate conversion data 22 shown in FIG. 1 includes the correspondence relationship between the peak intensity of the heat radiation light and the activation rate. This correspondence relationship is defined for each pulse width, for each acceleration energy of ion implantation, and for each type of a dopant. The activation rate conversion data 22 may be expressed by a function formula for calculating the estimated value of the activation rate from the peak intensity of the heat radiation light and may also be expressed by a numerical value table.

In this embodiment, the control device 20 detects the peak intensity of the heat radiation light for each shot of the pulsed laser beam. The estimated value of the activation rate is calculated based on the peak intensity and the activation rate conversion data 22.

The horizontal axes of FIGS. 6 and 7 represent the integral value of the intensity of the heat radiation light in a unit of "μVs" of the integral value of the output signal from the infrared detector 17, and the vertical axes represent the activation rate of phosphorus in a unit of "%". An integration range is equivalent to one shot of the pulsed laser beam. The circle symbol and the square symbol of FIGS. 6 and 7 respectively show the activation rates when annealing was performed under conditions of the pulse widths of 20 μs and 15 μs. The annealing objects 30 used in the evaluation experiments of FIGS. 6 and 7 are silicon wafers in which phosphorus was ion-implanted at the respective acceleration energies of 3 MeV and 2 MeV. The dose amount of phosphorus is $5 \times 10^{12}$ cm$^{-2}$ in any evaluation experiment of FIGS. 6 and 7.

From FIGS. 6 and 7, it can be seen that the activation rate becomes higher as the integral value of intensity of the heat radiation light increases. For this reason, by referring to the correspondence relationship between the integral value of intensity of the heat radiation light and the activation rate, it is possible to obtain the estimated value of the activation rate from the integral value of intensity of the heat radiation light. In a modification example of this embodiment, the activation rate conversion data 22 shown in FIG. 1 includes the correspondence relationship between the integral value of intensity of the heat radiation light and the activation rate. This correspondence relationship is defined for each pulse width, for each acceleration energy of ion implantation, and for each type of a dopant.

In the modification example of this embodiment, the control device 20 calculates the integral value of the intensity of the heat radiation light for each shot of the pulsed laser beam. The estimated value of the activation rate is calculated based on the integral value and the activation rate conversion data 22.

Next, another embodiment will be described with reference to FIGS. 8 and 9. Hereinafter, the differences from the embodiment shown in FIGS. 1 to 7 will be described, and with respect to common configurations, the description thereof will be omitted. In the embodiment shown in FIGS. 1 to 7, the pulse width of the pulsed laser beam is fixed. In the embodiment shown in FIGS. 8 and 9, the pulse width is adjusted for each shot of the pulsed laser beam, based on the intensity of the heat radiation light.

Figure 8:
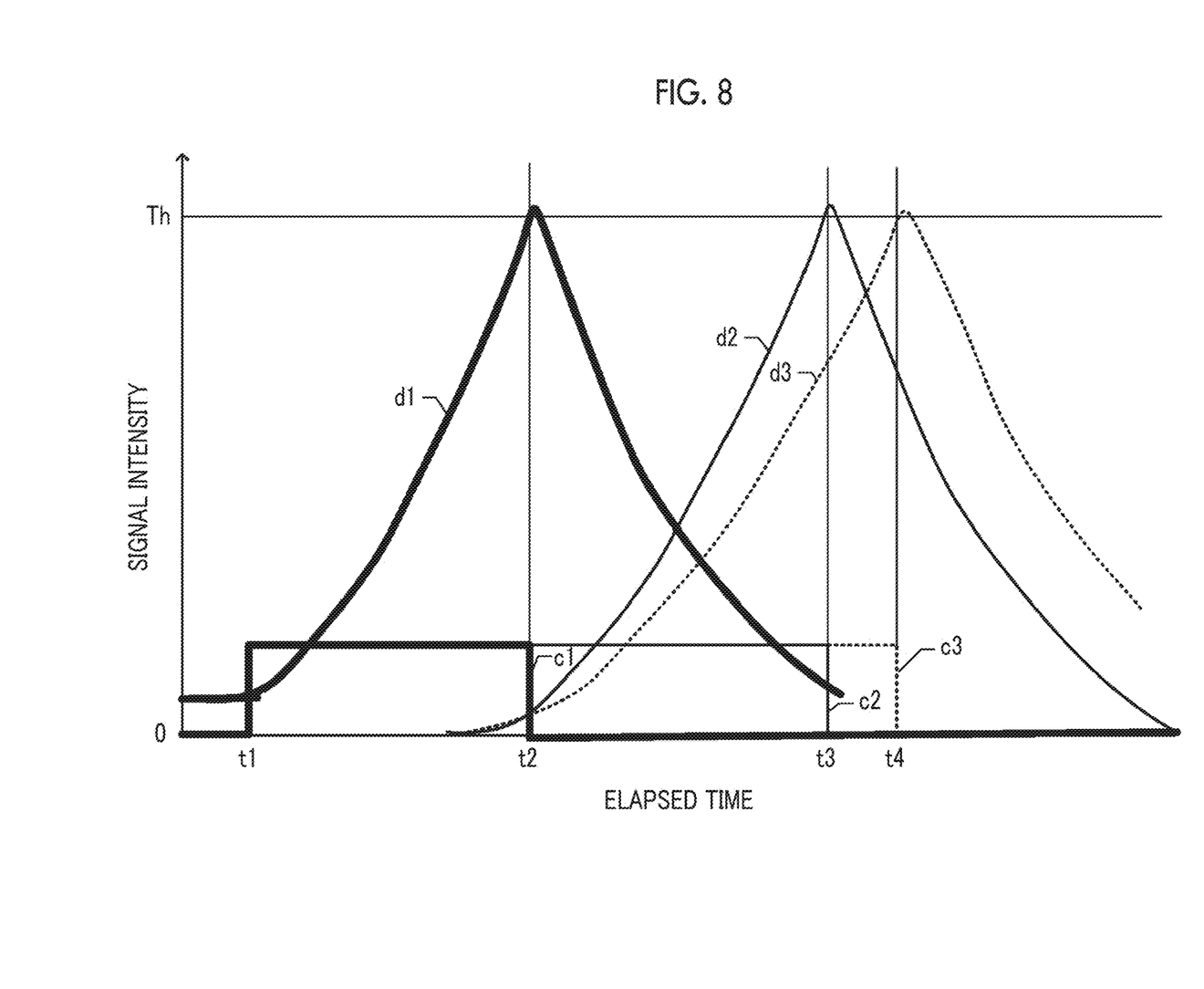
FIG. 8 is a graph showing an example of the waveform of one shot of the pulsed laser beam and a temporal change in the output signal from the infrared detector.

FIG. 8 shows an example of the waveform of one shot of the pulsed laser beam and a temporal change in the output signal from the infrared detector 17. The intensity of the output signal from the infrared detector 17 corresponds to the intensity of the heat radiation light, and therefore, the intensity of the output signal can be rephrased as the intensity of the heat radiation light.

Laser pulses c1, c2, and c3 of the pulsed laser beam are respectively shown by a thick solid line, a thin solid line, and a dashed line. A rise time of the laser pulses c1, c2, and c3 is indicated by time t1. The temporal changes of intensities d1, d2, and d3 of the heat radiation light when the laser pulses c1, c2, and c3 have been incident on the annealing object 30 are respectively shown by a thick solid line, a thin solid line, and a dashed line.

Even if the intensities of the laser pulses are the same, variation occurs in the degree of a rise in temperature due to various factors. For example, there is a case where the annealing object 30 has been preheated already at the point in time of the start of incidence of the laser pulse. As an example, preheating is advanced as the scanning of the laser beam is advanced at the time of laser annealing. In a case where the annealing object 30 has been preheated, the intensity d1 of the heat radiation light gradually becomes stronger according to a rise in the temperature of the annealing object 30, from directly after the time t1.

There is a case where a metal pattern is formed on the side opposite to the laser incidence surface of the annealing object 30. An area in which a metal pattern is formed has larger heat capacity than an area in which a metal pattern is not formed. For this reason, in the area in which a metal pattern is formed, it is more difficult for a temperature to rise than in the area in which a metal pattern is not formed. As a result, the intensity d3 of the heat radiation light in the area in which a metal pattern is formed rises more slowly than the intensity d2 of the heat radiation light in the area in which a metal pattern is not formed.

The control device 20 (FIG. 1) stores a threshold value Th which becomes a trigger to stop the incidence of the pulsed laser beam. The control device 20 stops the oscillation of the laser light source 10 if the arrival of the intensity of heat radiation light at the threshold value Th is detected. The times when the intensities d1, d2, and d3 of the heat radiation light reach the threshold value Th are respectively indicated by t2, t3, and t4. The laser pulses c1, c2, and c3 respectively fall at the times t2, t3, and t4. For this reason, after the times t2, t3, and t4, the respective intensities d1, d2, and d3 of the heat radiation light are gradually lowered.

Figure 9:
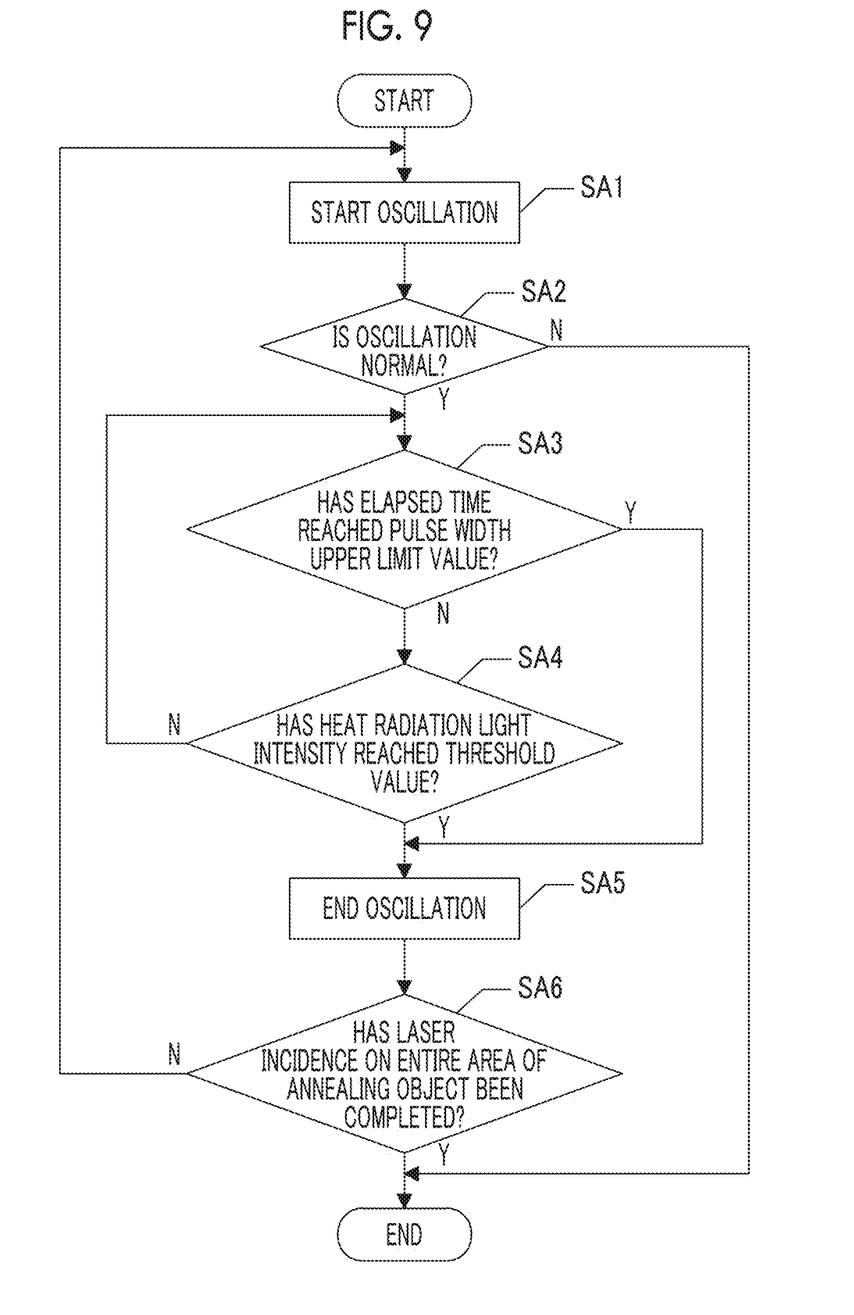
FIG. 9 is a flowchart of an annealing method using the laser annealing apparatus according to the embodiment.

FIG. 9 shows a flowchart of an annealing method using the laser annealing apparatus according to this embodiment. In Step SA1, the control device 20 (FIG. 1) commands the laser light source 10 to start oscillation. In this way, the pulse of the pulsed laser beam rises. In Step SA2, whether or not the oscillation is normal is determined. For example, by observing an operation of a driver circuit of the laser light source 10, the magnitude of a drive current, the intensity of the reflected light from the annealing object 30, or the like, it is possible to determine the normality of the oscillation.

In a case where the normality of the oscillation is not confirmed, annealing treatment is ended. In a case where the normality of the oscillation is confirmed, in Step SA3, whether or not an elapsed time from the point in time of the rise of the pulse has reached the rated upper limit value of the pulse width is determined. The rated upper limit value of the pulse width is determined based on the setting value of a repetition frequency of the pulse at the time of annealing treatment, and the rated upper limit values of the laser diode and the driver circuit.

In a case where the elapsed time has reached the rated upper limit value of the pulse width, in Step SA 5, the oscillation is stopped. In a case where the elapsed time has not reached the rated upper limit value of the pulse width, in Step SA4, whether or not the intensity of the heat radiation light has reached the threshold value Th (FIG. 8) is determined.

In a case where the intensity of the heat radiation light has reached the threshold value Th, in Step SA 5, the oscillation is stopped. In a case where the intensity of the heat radiation light has not reached the threshold value Th, the routine returns back to Step SA3. That is, in a case where the elapsed time from the rise of the pulse has reached the rated upper limit value of the pulse width, or a case where the intensity of the heat radiation light has reached the threshold value Th, the oscillation is stopped.

After the oscillation is stopped in Step SA 5, in Step SA6, whether or not the incidence of the pulsed laser beam on the entire area of the surface of the annealing object 30 has been completed is determined. In a case where the incidence of the pulsed laser beam on the entire area has been completed, the annealing treatment is ended. In a case where the incidence of the pulsed laser beam on the entire area has not been completed, the routine returns back to Step SA1 and the next oscillation is started at a set repetition frequency.

Next, the excellent effects of the embodiment shown in FIGS. 8 and 9 will be described. In a case where the conditions such as the degree of the preheating of the annealing object 30 and the presence or absence of a metal pattern are different, if laser annealing is performed with a constant laser width, data in which variation is present in the peak intensity of the heat radiation light due to the differences of these conditions is obtained. That is, variation occurs in the activation rate according to the locations in the plane of the annealing object 30.

In the embodiment shown in FIG. 8, at the point in time when the peak intensity of the heat radiation light has reached the threshold value, the laser pulse falls. For this reason, it is possible to suppress variation in the peak intensity of the heat radiation light. As a result, variation in the activation rate is also suppressed.

Next, still another embodiment will be described with reference to FIGS. 10 to 12. Hereinafter, the differences from the embodiment shown in FIGS. 1 to 7 will be described, and with respect to common configurations, the description thereof will be omitted.

Figure 10:
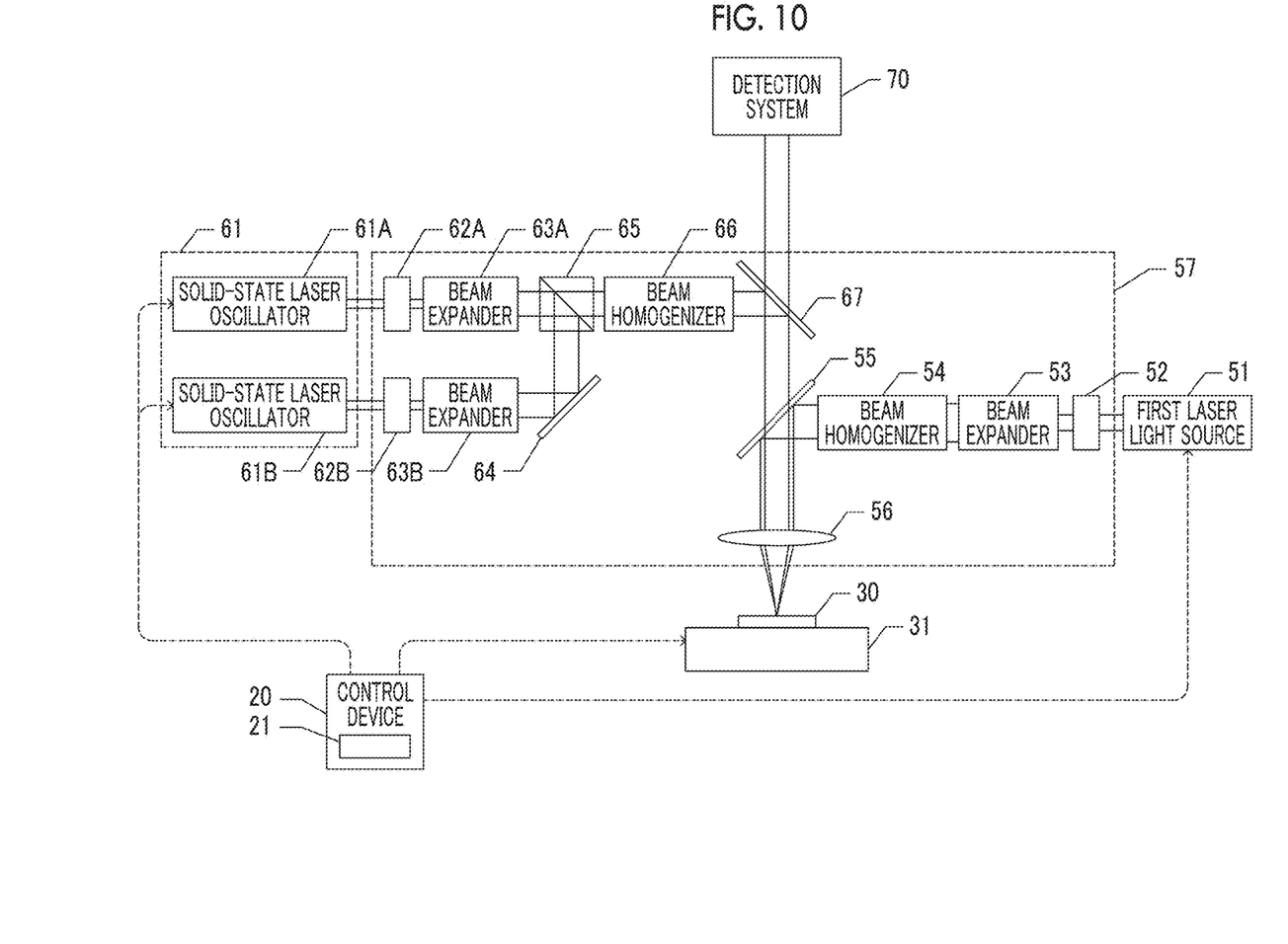
FIG. 10 is a schematic diagram of a laser annealing apparatus according to another embodiment.

FIG. 10 shows a schematic diagram of a laser annealing apparatus according to this embodiment. This laser annealing apparatus has a first laser light source 51 and a second laser light source 61. A laser diode is used for the first laser light source 51. The first laser light source 51 outputs a pulsed laser beam having a wavelength of 808 nm, for example. The second laser light source 61 is configured of solid-state laser oscillators 61A and 61B. Each of the solid-state laser oscillators 61A and 61B outputs a pulsed laser beam having a wavelength of a green band. For example, an Nd:YAG laser, an Nd:YLF laser, an Nd:YVO$_4$ laser, or the like, which outputs a secondary harmonic, is used for each of the solid-state laser oscillators 61A and 61B.

The pulsed laser beam output from the first laser light source 51 and the pulsed laser beam output from the second laser light source 61 are incident on the annealing object 30 via a propagation optical system 57. The pulsed laser beam output from the first laser light source 51 and the pulsed laser beam output from the second laser light source 61 are incident on the same area of the surface of the annealing object 30. The annealing object 30 is held on the stage 31.

Next, the configuration and the operation of the propagation optical system 57 will be described. The pulsed laser beam output from the first laser light source 51 is incident on the annealing object 30 via an attenuator 52, a beam expander 53, a beam homogenizer 54, a dichroic mirror 55, and a condenser lens 56.

The pulsed laser beam output from the solid-state laser oscillator 61A on one side is incident on a beam splitter 65 via an attenuator 62A and a beam expander 63A. The pulsed laser beam output from the solid-state laser oscillator 61B on the other side is incident on the beam splitter 65 via an attenuator 62B, a beam expander 63B, and a mirror 64. The pulsed laser beams output from the two solid-state laser oscillators 61A and 61B join each other at the beam splitter 65 and are then propagated along a common pathway.

The pulsed laser beam which has joined a single pathway at the beam splitter 65 is incident on the annealing object 30 via a beam homogenizer 66, a dichroic mirror 67, the dichroic mirror 55, and the condenser lens 56.

The dichroic mirror 55 reflects light in a wavelength range of 800 nm and transmits light in other wavelength ranges. The dichroic mirror 67 reflects light in a wavelength range of green and transmits light in other wavelength ranges. The control device 20 controls the first laser light source 51 and the second laser light source 61, and the stage 31.

The heat radiation light from the annealing object 30 is transmitted through the condenser lens 56 and the dichroic mirrors 55 and 67 and then is incident on a detection system 70. Further, light for measurement output from the detection system 70 is transmitted through the dichroic mirrors 67 and 55, is converged by the lens 56, and then is incident on the annealing object 30. Reflected light from the annealing object 30 advances along the same pathway in the reverse direction and is incident on the detection system 70.

The pulsed laser beam output from the first laser light source 51 heats mainly a deep region of the annealing object 30. In this way, the dopant in the deep region is activated.

The pulse width of each of the pulsed laser beams which are output from the two solid-state laser oscillators 61A and 61B of the second laser light source 61 is about 100 ns. That is, the pulse width is shorter than 1/100 of the pulse width of the pulsed laser beam which is output from first laser light source 51. Further, the peak intensity of each of the pulsed laser beams which are output from the solid-state laser oscillators 61A and 61B is sufficiently larger than the peak intensity of the pulsed laser beam which is output from first laser light source 51. The pulsed laser beam output from the second laser light source 61 and having a short pulse and high intensity melts a surface layer portion of the annealing object 30. When the melted surface layer portion is recrystallized, the dopant is activated. The second laser light source 61 is used for the activation of the dopant in a relatively shallow region.

Figure 11:
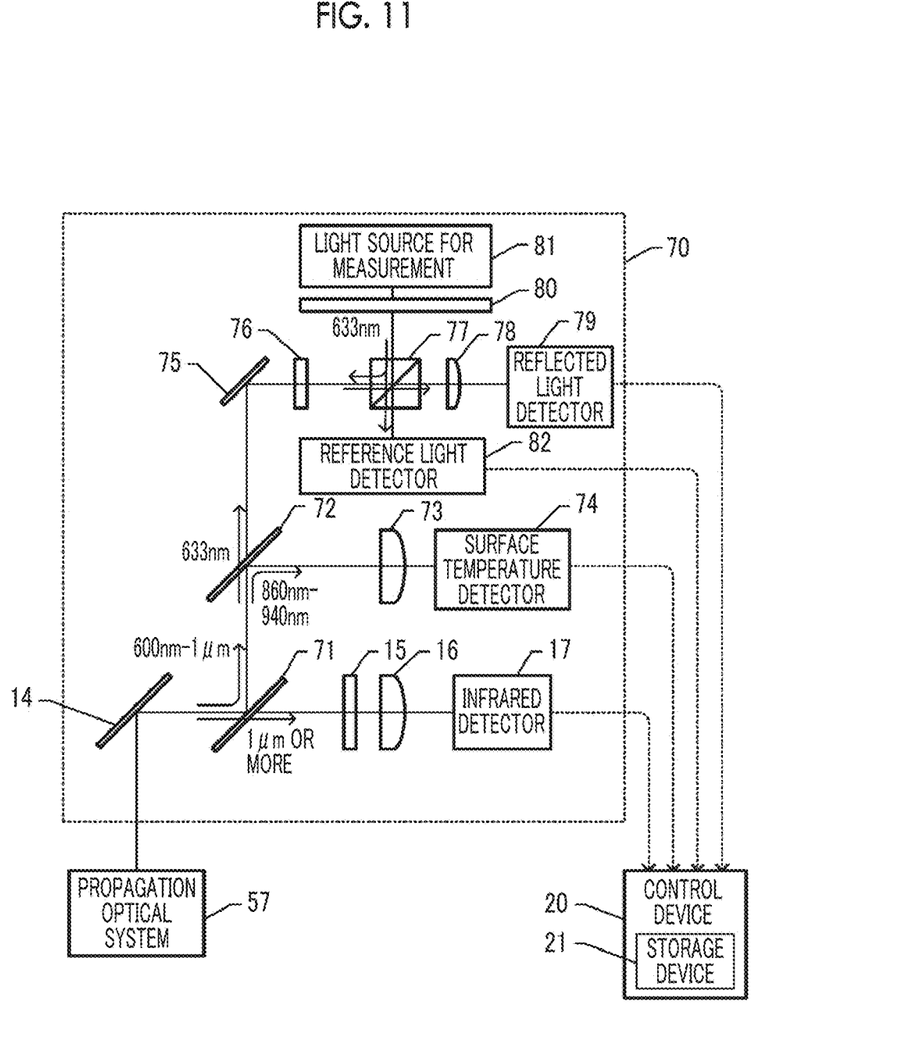
FIG. 11 is a schematic diagram of a detection system of the laser annealing apparatus shown in FIG. 10.

FIG. 11 shows a schematic diagram of the detection system 70. The configurations of the total reflection mirror 14, the optical filter 15, the lens 16, and the infrared detector 17 are the same as the configurations of those in the embodiment shown in FIG. 1. A dichroic mirror 71 is disposed between the total reflection mirror 14 and the optical filter 15. The dichroic mirror 71 transmits light in a wavelength range of 1 μm or more and reflects light in a wavelength range of greater than or equal to 600 nm and less than 1 μm.

The light in a wavelength range of less than 1 μm, of the heat radiation light which has been incident on the detection system 70 from the propagation optical system 57, is reflected by the dichroic mirror 71 and is incident on a next dichroic mirror 72. The dichroic mirror 72 reflects light in a wavelength range of greater than or equal to 860 nm and less than or equal to 940 nm and transmits light having a wavelength of 633 nm. The heat radiation light reflected by the dichroic mirror 72 is converged by a lens 73 and then is incident on a surface temperature detector 74. For example, an avalanche photodiode can be used for the surface temperature detector 74.

For the surface temperature detector 74, high-speed response is required in order to detect rapid melting by a short pulse. By using the avalanche photodiode for the surface temperature detector 74, it is possible to secure sufficient high-speed response.

A light source for measurement 81 outputs a laser beam for measurement. For example, a HeNe laser oscillator can be used for the light source for measurement 81. An output wavelength of the HeNe laser oscillator is about 633 nm. The laser beam output from the light source for measurement 81 is transmitted through a half-wave plate 80 and is then branched at a beam splitter 77.

The laser beam straightly passed through the beam splitter 77 is incident on a reference light detector 82. The laser beam reflected by the beam splitter 77 is incident on the propagation optical system 57 via a quarter-wave plate 76, a total reflection mirror 75, the dichroic mirrors 72 and 71, and the total reflection mirror 14.

The laser beam reflected by the annealing object 30 (FIG. 1) advances along the same pathway in the reverse direction and is incident on the beam splitter 77. The laser beam for measurement passes through the quarter-wave plate 76 twice in a forward path and a backward path, and therefore, the reflected laser beam straightly passes through the beam splitter 77. Thereafter, the reflected laser beam is converged by a lens 78 and is incident on a reflected light detector 79.

The detection results of the infrared detector 17, the surface temperature detector 74, the reflected light detector 79, and the reference light detector 82 are input to the control device 20. The control device 20 determines the temperature of the melted surface layer portion of the annealing object 30 from the detection result of the surface temperature detector 74. Further, the control device 20 calculates the reflectance of the surface of the annealing object 30 from the detection results of the reflected light detector 79 and the reference light detector 82. If the surface layer portion of the annealing object 30 is melted, the reflectance becomes higher, and therefore, it is possible to calculate a melting time from the calculation result of the reflectance. It is possible to calculate the depth of a melted portion, based on a melting time. Further, in a case where the intensity of the light for measurement is constant, whether or not the annealing object 30 has been melted can be determined from only the detection result of the reflected light detector 79.

Figure 12:
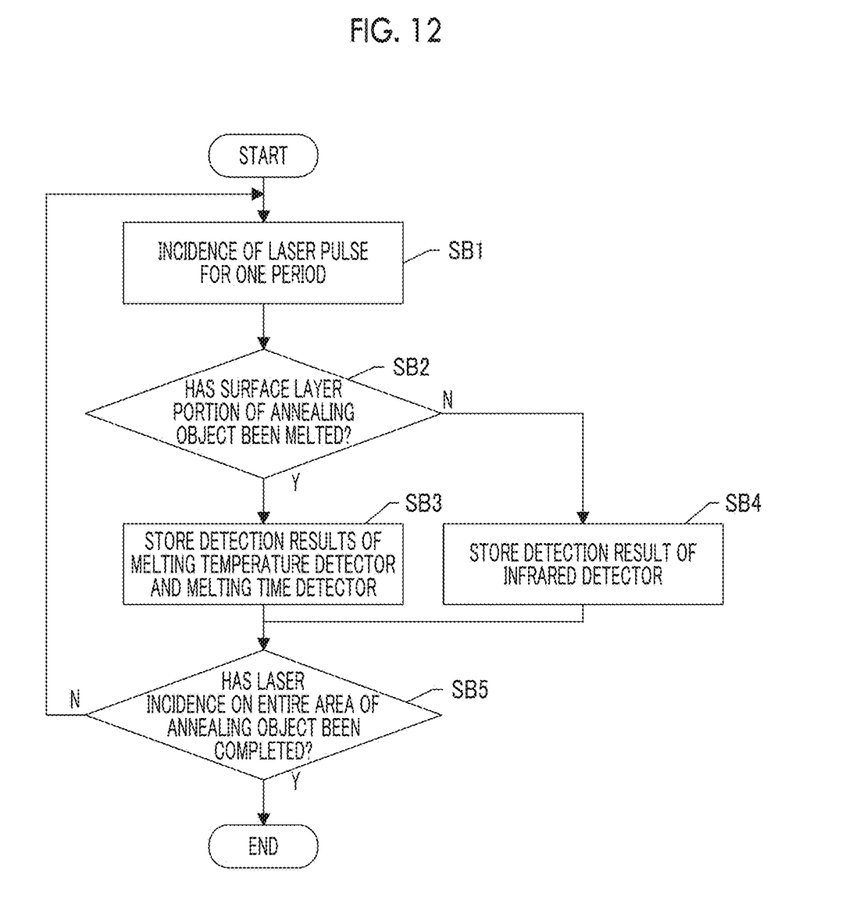
FIG. 12 is a flowchart of an annealing method using the laser annealing apparatus shown in FIGS. 10 and 11.

FIG. 12 shows a flowchart of an annealing method using the laser annealing apparatus according to this embodiment. In Step SB1, irradiation for one period of a pulsed laser beam is performed on the annealing object 30 (FIG. 10). A specific aspect of the "irradiation for one period" varies according to the purpose of the annealing. For example, the "irradiation for one period" includes aspects such as the incidence of one shot of the pulsed laser beam from the first laser light source 51, the incidence of one shot of the pulsed laser beam from the second laser light source 61, and the incidence by one shot of the pulsed laser beam from the first laser light source 51 and the pulsed laser beam from the second laser light source 61.

In Step SB2, whether or not the surface layer portion of the annealing object 30 has been melted by the irradiation performed in Step SB1 is determined. With regard to whether or not the surface layer portion of the annealing object 30 has been melted, in a case where the signal intensity from the reflected light detector 79 exceeds a certain threshold value and is maintained for a certain period of time or more, it is determined that the surface layer portion has been melted.

In a case where the surface layer portion of the annealing object 30 has been melted, in Step SB3, the detection result from the surface temperature detector 74 and the detection results from the reflected light detector 79 and the reference light detector 82 (FIG. 11) are stored in the storage device 21 (FIG. 10). In a case where the surface layer portion of the annealing object 30 has not been melted, in Step SB4, the detection result of the infrared detector 17 (FIG. 11) is stored in the storage device 21 (FIG. 10).

After Step SB3 or SB4, in Step SB5, whether or not the incidence of the pulsed laser beam on the entire area of the annealing object 30 has been completed is determined. In a case where the incidence of the pulsed laser beam on the entire area has been completed, the annealing treatment is ended. In a case where the incidence of the pulsed laser beam on the entire area has not been completed, the routine returns back to Step SB1 and the irradiation for nest one period is performed at a set repetition frequency.

In the laser annealing apparatus according to the embodiment shown in FIGS. 10 to 12, by melting a relatively shallow region by the second laser light source 61, it is possible to activate the dopant in the shallow region. Further, the dopant in a relatively deep region can be activated in a non-melted state by the first laser light source 51. In a case of performing annealing under the condition that the surface layer portion is melted, it is possible to estimate the depth of a melted portion by the detection results of the detection system 70. In a case of performing annealing under the condition that the surface layer portion is not melted, it is possible to estimate the activation rate of the dopant in the deep region by the detection results of the detection system 70.

If the surface layer portion is melted, the heat radiation light from the deep region is reflected or absorbed by the melted portion. For this reason, in the infrared detector 17, the heat radiation light from only the melted portion is detected and the heat radiation light from a region deeper than the melted portion is not detected. As a result, information about the temperature of the deep region is not obtained from the detection result of the infrared detector 17. That is, it is difficult to obtain significant information from the detection result of the infrared detector 17. In this embodiment, in a case where the surface layer portion of the annealing object 30 has been melted, the detection result of the infrared detector 17 which does not include significant information is not stored in the storage device 21.

Conversely, in a case where the surface layer portion of the annealing object 30 has not been melted, the detection results of the surface temperature detector 74, the reflected light detector 79, and the reference light detector 82 for calculating a melting depth are not stored in the storage device 21.

As described above, in the embodiment shown in FIGS. 10 to 12, only some of data among various types of data detected in the detection system 70 (FIG. 11) is stored in the storage device 21. It is possible to reduce the amount of data, compared to a case of storing all the data in the storage device 21. If the repetition frequency of the pulse is increased and the amount of data which is generated per period is increased, there is a case where a data transfer rate becomes a bottleneck and thus all the data cannot be stored. In the embodiment shown in FIGS. 10 to 12, only significant data is extracted and stored in the storage device 21, and therefore, it becomes easy to avoid a bottleneck due to a data transfer rate.

In FIG. 12, in Step SB4, only the detection result of the infrared detector 17 is stored in the storage device 21. However, the detection result of the surface temperature detector 74 may be further stored. In this way, it is possible to preserve both of information about the temperature to the relatively deep region and information about the temperature of only the relatively shallow region.

The present invention has been described above in connection with the embodiments. However, the present invention is not limited thereto. It will be apparent to those skilled in the art that, for example, various changes, improvements, combinations, or the like can be made.

It should be understood that the invention is not limited to the above-described embodiment, but may be modified into various forms on the basis of the spirit of the invention. Additionally, the modifications are included in the scope of the invention.

What is claimed is:

1. A laser annealing apparatus comprising:
a laser light source which outputs a laser beam;
a stage which holds an annealing object at a position on which the laser beam output from the laser light source is incident;
an infrared detector which detects heat radiation light from the annealing object held on the stage;
an optical element which is disposed in a pathway of the heat radiation light from the annealing object to the infrared detector and does not allow light having a wavelength shorter than 1 µm to be incident on the infrared detector; and
a control device in which activation rate conversion data which defines a correspondence relationship between intensity of the heat radiation light which is detected by the infrared detector, and an activation rate of a dopant implanted into the annealing object is stored,
wherein the control device determines an estimated value of the activation rate, based on a detection result of the infrared detector and the activation rate conversion data.

2. The laser annealing apparatus according to claim 1, further comprising:
an output device,
wherein the control device outputs the estimated value to the output device.

3. The laser annealing apparatus according to claim 1, wherein the laser beam which is output from the laser light source is a pulsed laser beam,
the infrared detector detects intensity of the heat radiation light from the annealing object for each shot of the pulsed laser beam, and
the control device determines an estimated value of the activation rate, based on a peak value of the intensity of the heat radiation light detected by the infrared detector.

4. The laser annealing apparatus according to claim 1, wherein the laser beam which is output from the laser light source is a pulsed laser beam,
the infrared detector detects intensity of the heat radiation light from the annealing object for each shot of the pulsed laser beam, and
the control device determines an estimated value of the activation rate, based on an integral value of the intensity of the heat radiation light detected by the infrared detector.

5. The laser annealing apparatus according to claim 1, wherein the laser beam which is output from the laser light source is a pulsed laser beam,
the infrared detector detects intensity of the heat radiation light from the annealing object for each shot of the pulsed laser beam, and
the control device
stores a threshold value which becomes a trigger to stop incidence of the pulsed laser beam, and
stops output from the laser light source if the intensity of the heat radiation light exceeds the threshold value.

6. The laser annealing apparatus according to claim 3, further comprising:
a surface temperature detector which detects the heat radiation light from a surface of the annealing object;
a light source for measurement which makes light for measurement incident on the annealing object; and
a reflected light detector which detects reflected light from the annealing object, of the light for measurement output from the light source for measurement,
wherein the control device
determines whether or not a surface layer portion of the annealing object has been melted, based on intensity of the reflected light detected by the reflected light detector, for each period of the pulsed laser beam output from the laser light source.

7. The laser annealing apparatus according to claim 6, wherein the control device
stores a detection result of the infrared detector in a case where it is determined that the surface layer portion of the annealing object has not been melted, and
stores a detection result of the reflected light in a case where it is determined that the surface layer portion of the annealing object has been melted.

8. The laser annealing apparatus according to claim 6, wherein the control device further stores a detection result of the surface temperature detector in a case where it is determined that the surface layer portion of the annealing object has been melted.

* * * * *